(12) United States Patent
Kroneberger (10) Patent No.: US 6,287,385 B1
(45) Date of Patent: Sep. 11, 2001

(54) SPRING CLIP FOR SENSITIVE SUBSTRATES

(75) Inventor: Cris Keith Kroneberger, Fairfield, CA (US)

(73) Assignee: The BOC Group, Inc., Murray Hill, NJ (US)

( * ) Notice: Subject to any disclaimer, the term of this patent is extended or adjusted under 35 U.S.C. 154(b) by 0 days.

(21) Appl. No.: 09/430,724

(22) Filed: Oct. 29, 1999

(51) Int. Cl.⁷ .................................................. B05C 13/02
(52) U.S. Cl. ......................... 118/503; 118/728; 269/254 R
(58) Field of Search ................................ 118/500, 503, 118/728; 269/254 R; 204/297.09, 297.1, 297.14; 294/99.1

(56) References Cited

U.S. PATENT DOCUMENTS

| | | | |
|---|---|---|---|
| 3,756,550 | 9/1973 | Kollitz | 248/206.5 |
| 4,473,455 | 9/1984 | Dean et al. | 204/298.15 |
| 4,779,877 | 10/1988 | Shaw | 279/4.04 |
| 4,971,676 | 11/1990 | Doue et al. | 118/503 |
| 5,136,754 | 8/1992 | Kuroda | 24/67.9 |
| 5,458,322 | * 10/1995 | Kulkaski et al. | 269/254 R |
| 5,605,866 | * 2/1997 | McClanahan et al. | 118/728 |
| 5,820,684 | 10/1998 | Genard et al. | 118/728 |

* cited by examiner

*Primary Examiner*—Laura Edwards
(74) *Attorney, Agent, or Firm*—Philip H. Von Neida; Salvatore P. Pace (57) ABSTRACT

An improved restraining clip for holding fragile substrates has been invented. The clip can be used to provide a force on the backside of substrates during processing. The invention has a compound spring mechanism, effectively uncoupling the force used to hold the substrate from that applied by an operator to move the clip. The preferred configuration incorporates a multiple leaf spring for providing force to the substrate, a coil spring to hold the clip in place, and a lever arm for the operator to provide lifting and turning forces on the clip. This combination of features allows the clip to be used on fragile substrates, such as Ga—As, which are easily damaged by other clips.

22 Claims, 9 Drawing Sheets

SPRING CLIP FOR SENSITIVE SUBSTRATES

BACKGROUND OF THE INVENTION

This invention generally relates to support structures for restraining substrates, such as semiconductor wafers, during processing. The invention further relates to a compound spring assembly that can be easily manipulated by an operator with forces that exceed the strength of the substrate while imparting forces for restraining the substrate without damage.

DESCRIPTION OF THE PRIOR ART

The deposition, or coating, of materials is a process that is widely used in the manufacturing of many semiconductor and optical components. An example of a batch processor 111 that can perform this type of process is shown schematically in FIG. 1. Batch processor 111 includes a vacuum chamber 101, an evaporative source 103 of coating material 105, and a framework 107 generally positioned to uniformly coat a plurality of optical components, flat panel display panels, semiconductor wafers or other substrates 109 that are usually located approximately equidistant from source 103. Using an evaporative source, coating materials may include many metals, semiconductors and refractory materials. Vacuum chamber 101 is opened, and substrates 109 are manually loaded onto framework 107 one at a time. The number of substrates that can be held by a framework varies with the substrate, chamber and framework size, with frameworks typically adapted to hold substrates of 25 mm to 200 mm in diameter or larger. Framework 107 is connected to a motor 113, rotating the framework within the chamber to increase the uniformity of coating material 105 being deposited. Other systems, not shown, may have fixed frameworks, while others may incorporate multiple frameworks and planetary or other rotational systems for moving substrates about to produce a specific coating effect.

Figure 1:
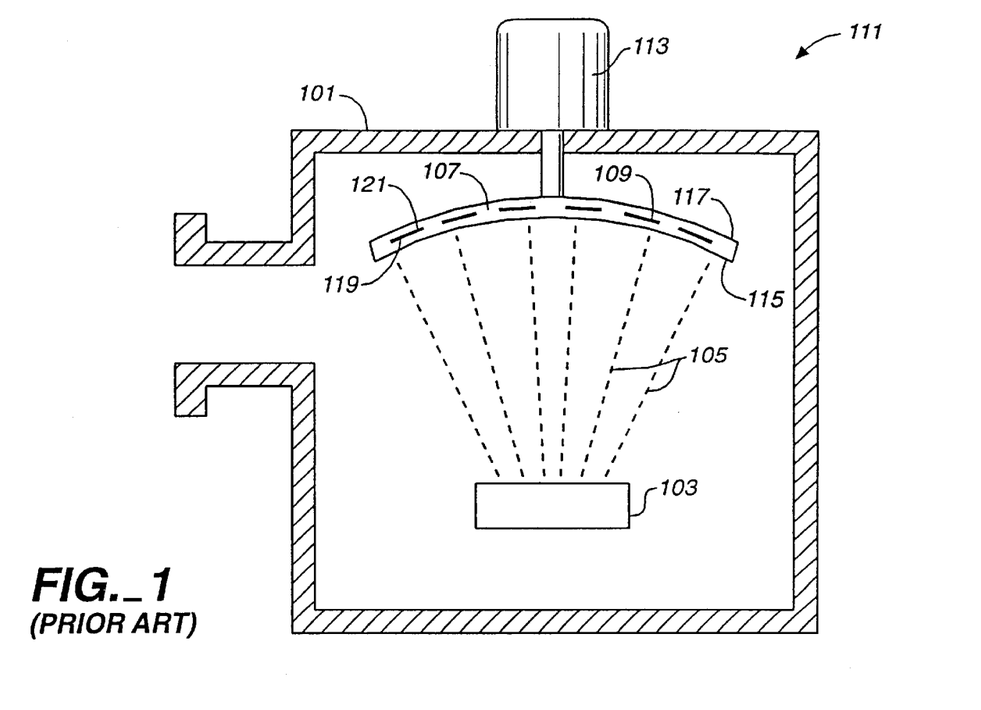
FIG. 1, previously described, is a schematic of prior art vacuum deposition systems.
Figure 2:
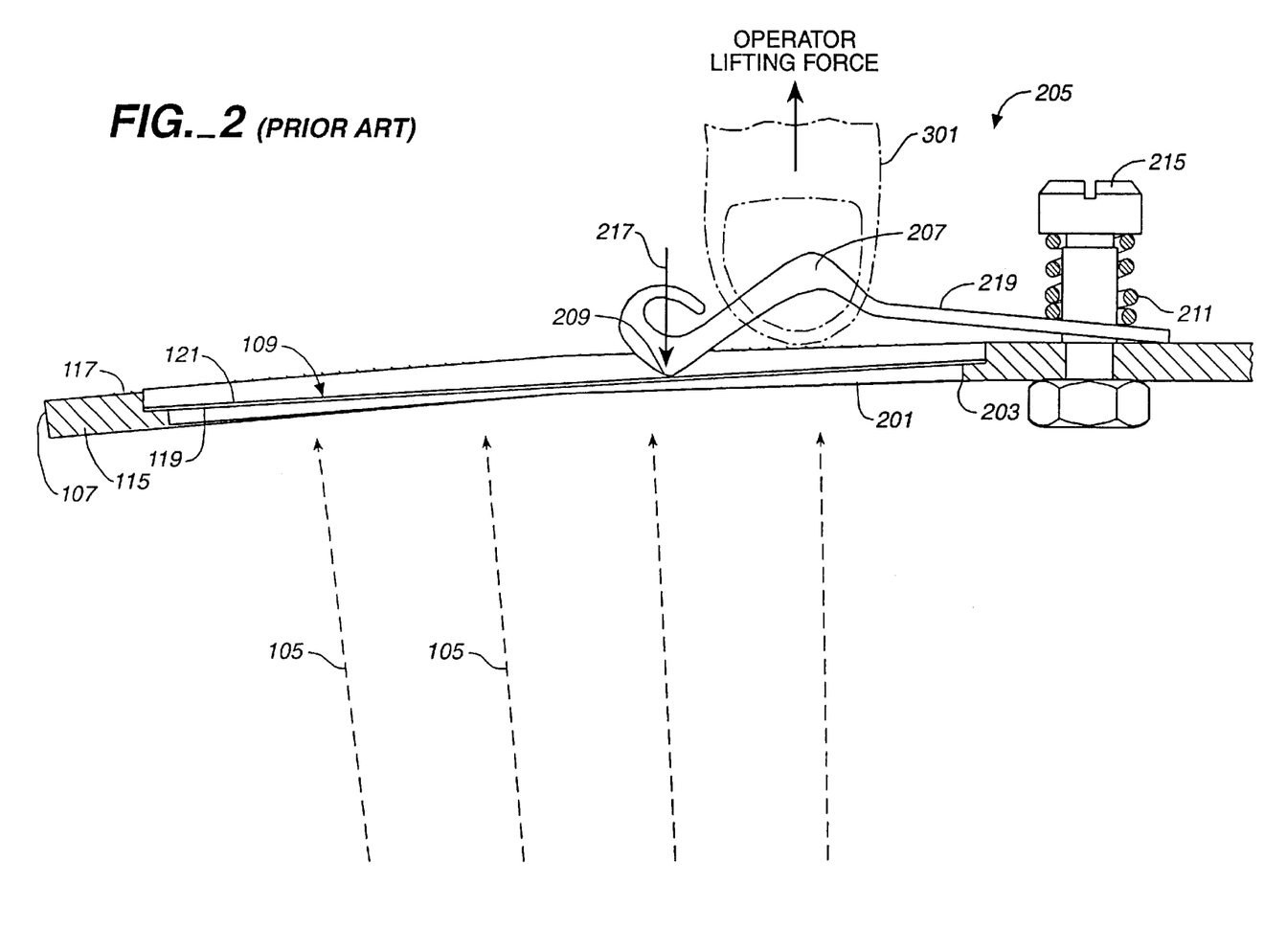
FIG. 2, previously described, is a side view detail of a first prior art clip shown restraining a substrate.
Figure 3:
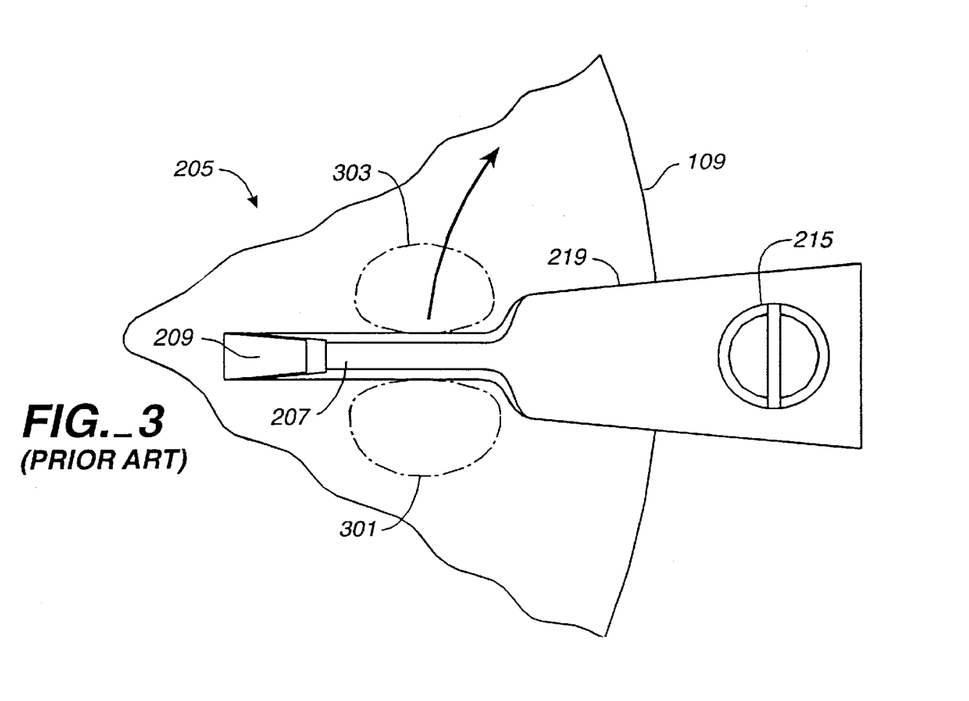
FIG. 3, previously described, is a top view of a first prior art clip.

At the low pressures under which evaporative coating operations occur, typically $10^{-6}$ to $10^{-7}$ Torr, material 105 travels in a straight line from source 103, coating surfaces with a direct line-of-sight to the source. In the configuration of FIG. 1, a framework front side 115 and substrate front side 119 both face source 103 and are coated, while a framework back side 117 and substrate back side 121 face away from source 103 and are generally not coated. Details of one of the many substrates which may be held in the prior art framework is shown in FIGS. 2 and 3. Substrate 109 is placed over one of the apertures 201, which are located over much of the framework surface and have a shape roughly the same as the substrates they are meant to hold. Substrate 109 is supported on substrate front side 119 by a plurality of aperture tabs or an aperture lip 203, which supports some or all of the edge of substrate 109, and on substrate back side 121 by a prior art clip mechanism 205. Some systems have more than one clip for each substrate, especially for larger substrates, with a 150 mm substrate having 2 to 4 clips holding it in place. A substrate restraining force 217 is transferred from a deflected coil spring 211 to a substrate contact point 209 by a clip 219, which is rigid and metallic. Typical prior art clips are made of alloys such as stainless steel or Inconel, with a thickness and shape that allow them to be rigid. Clip 219 can be pulled away from substrate 109 by pinching a clip handle 207 between thumb 301 and forefinger 303, and rotated clear of aperture 201 about a pivot pin 215, as shown in FIG. 3.

Figure 4:
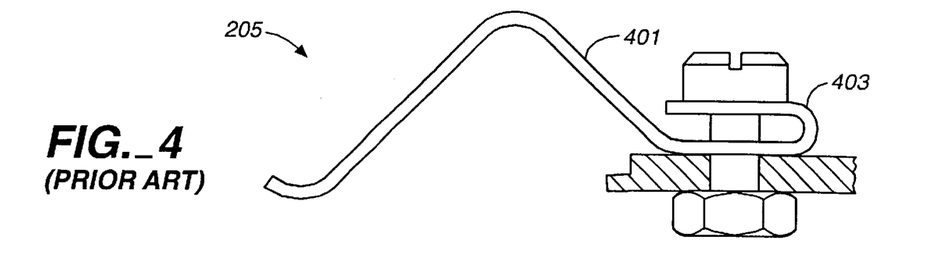
FIG. 4, previously described, is a side view of a second prior art clip.
Figure 5:
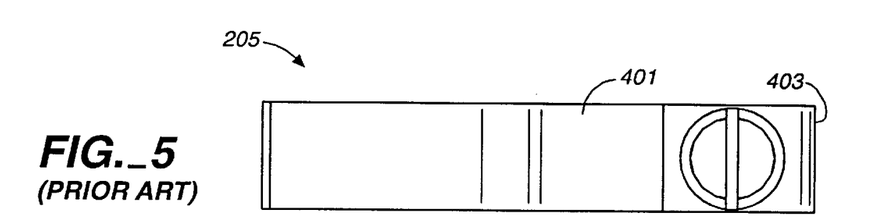
FIG. 5, previously described, is a top view of a second prior art clip.

A second prior art clip mechanism 401 is shown in side and top view in FIGS. 4 and 5, respectively. In clip mechanism 205, a combined clip spring 401 is made of a mildly flexible metal, producing less of a restraining force than prior art clip mechanism 205. In addition, coil spring 211 of the first prior art clip has been incorporated directly into the clip through a bend 403. For this configuration, clip materials and shapes are chosen to allow some spring force to be imparted by the clip.

The first and second prior are clips of FIGS. 2 through 5 were designed primarily for substrates that can withstand the forces imparted by those clips, and the spring force acts to both restrain the clip and hold the substrate. These clips have wide utility, though not without problems, with silicon substrates. As galium-arsenide (Ga—As) substrates have become more common, several problems in using prior art clips to restrain the more fragile Ga—As substrates have become evident, mainly due to their imparting a large force over a small substrate area. Consider the first prior art clip of FIGS. 2 and 3. Rigid clip 219 can rotate about pivot pin 215 and is held in place by stiff coil spring 211. This clip design has several drawbacks. Since the prior art clip is held in place against the substrate by a stiff spring, the force imparted by the clip has a limited lower value—it is difficult to design such a clip with a small force. If the operator accidentally releases clip handle 207 before placing it on substrate 109, clip 219 is forced by stiff spring 211 onto substrate 109, damaging more fragile substrate materials such as Ga—As. Another drawback of this design is that since stiff spring 211 also keeps the clip rigid, slight deformities due to mishandling the clip may result in a clip contact surface 209 smaller than the design area, with an increase in the substrate contact forces. Yet another drawback is that clip handle 207 is close to substrate back side 121, and thus the operator must be very careful not to touch the substrate. The second prior art clip of FIGS. 4 and 5 incorporates a less rigid, and slightly elastic material for a combined clip and stiff spring 403. This design is slightly better at maintaining a maximum contact surface with substrate 109, but suffers from many of the same limitations as the first clip design.

The limitations of prior art clips with fragile substrates has been noted, and have been partially addressed by the use of slotted restraining devices that hold the substrate by the application of forces primarily on the edge of the substrate. In U.S. Pat. No. 4,971,676, Doue et al. describe a framework in which a substrate is held in place by one edge spring and a plurality of edge abutments. Although that invention places less stress on a substrate once it is in place, other problems result from the sliding required in placing or removing the substrate. For example, inserting the substrate into the narrow slots defined by the edge abutments can result in breakage of fragile substrates. In addition the sliding required by that invention can scratch or create and deposit an unacceptable level of particulate matter on the substrate surface.

SUMMARY OF THE INVENTION

It is an advantage of the present invention that the substrate restraining force imparted by the clip is uncoupled from the force that holds the clip in place.

It is a further advantage of the present invention to impart restraining forces on a fragile substrate that will result in a lower incidence of substrate damage.

It is another advantage of the present invention that forces used by the operator in positioning the present invention on a fragile substrate are not imparted onto the substrate.

It is a further advantage of the present invention that the forces used by the operator with the present invention provide positive and firm control while imparting a much smaller force on a substrate.

It is yet a further advantage of the present invention that the force imparted onto the substrate occurs over a larger contact area and at multiple points by the use of multiple leaves.

It is a further advantage of the present invention that the operators fingers are kept way from the wafer during operation.

It is yet another advantage that the present invention be simple and inexpensive to manufacture and be easy to use.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

An Embodiment of the Present Invention

Figure 9:
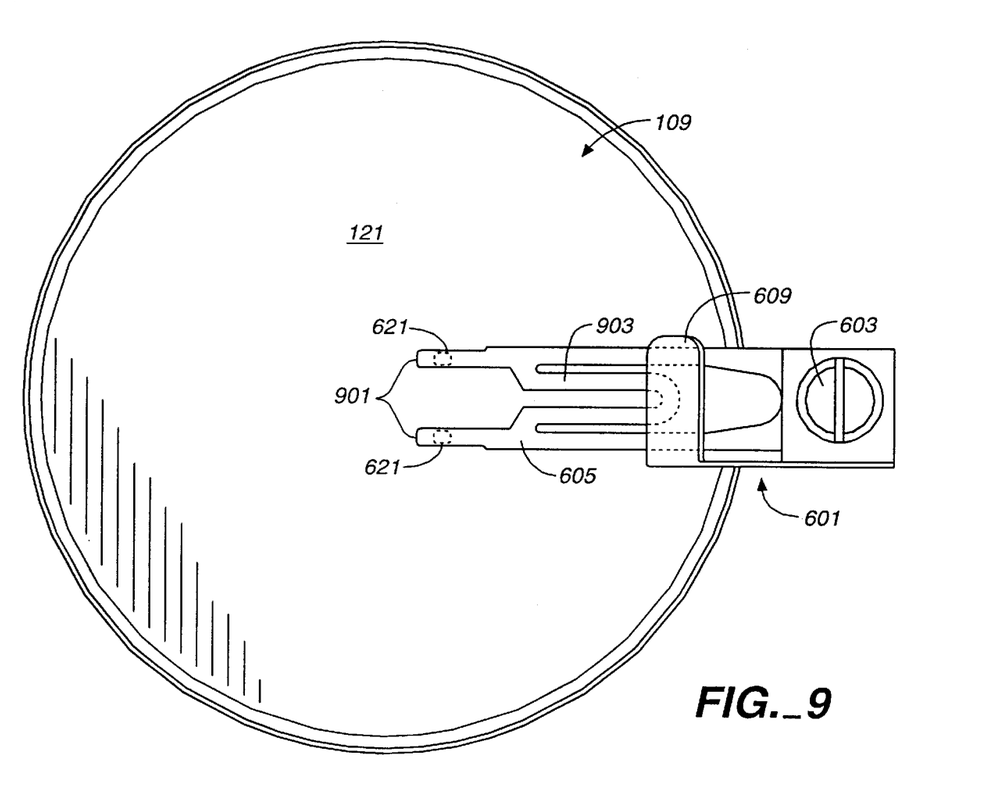
FIG. 9 is a top view of the first clip embodiment.
Figure 10:
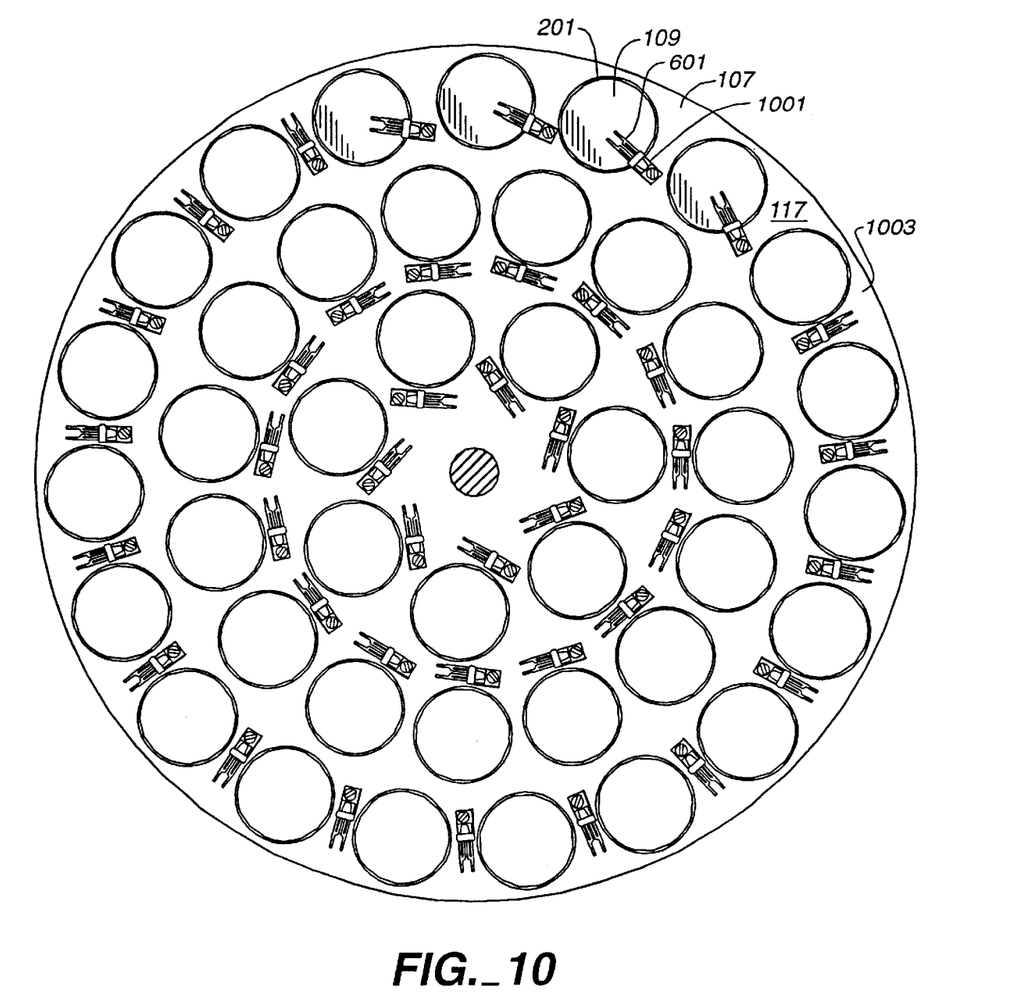
FIG. 10 is a detail of the framework apparatus.
Figure 11:
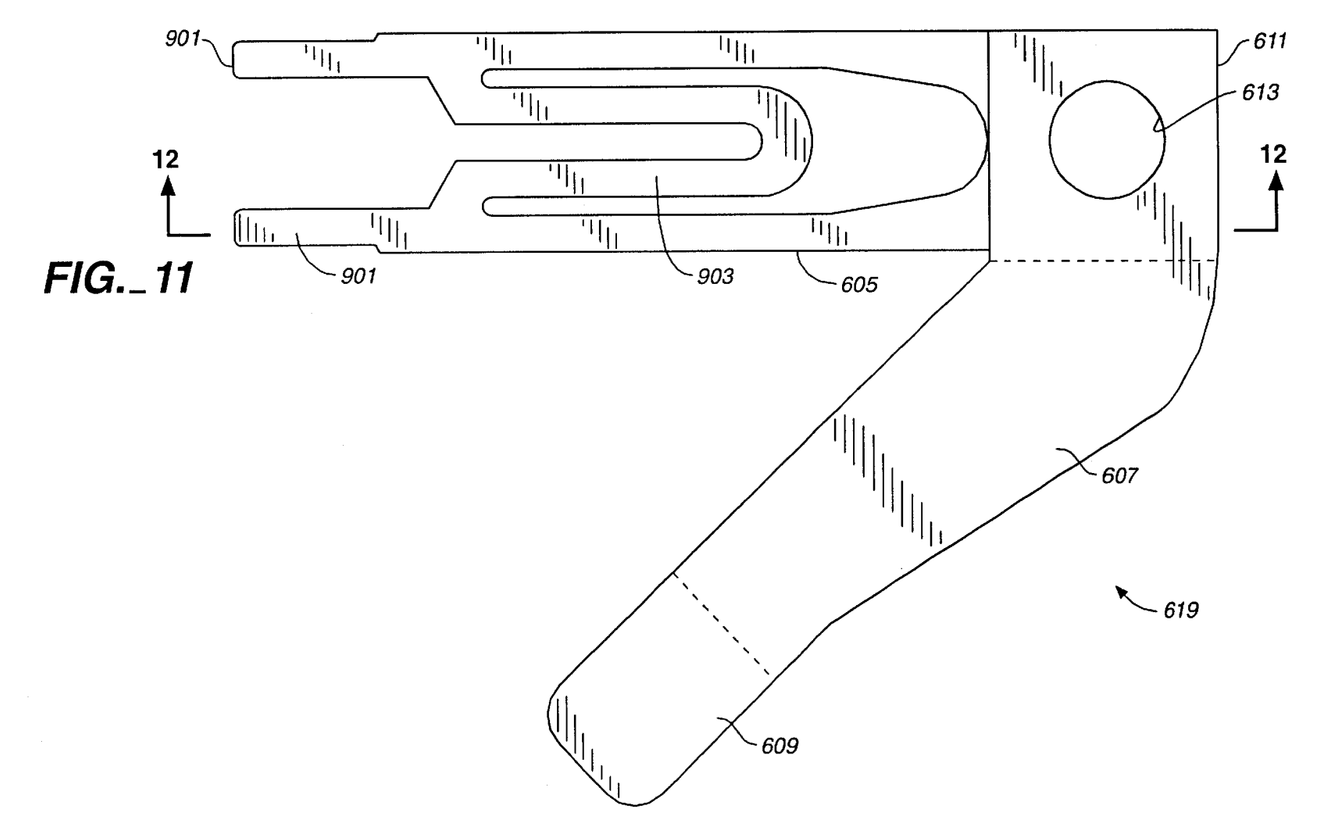
FIG. 11 shows a flat pattern of the first clip embodiment before bending.
Figure 12:
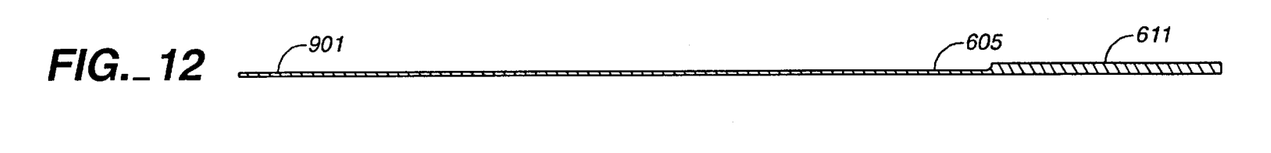
FIG. 12 is a section view of the first clip embodiment through one prong.

FIGS. 6 to 12 show a first embodiment of the present invention. The figures include static and moving side views (FIGS. 6 and 8), an end view (FIG. 7), two top views (FIGS. 9 and 10), and clip pattern drawings (FIGS. 11 and 12). As shown in FIGS. 6 to 9, the first clip embodiment has a compound spring clip assembly 601 that includes a combined spring clip and lever arm 619 that can rotate about a pivot pin 603. Components of spring and lever 619 include a leaf spring 605 and a lever arm 607 with a clip handle 609, and a clip supporting member 611 that has a pivot hole 613 through which pivot pin 603 passes. Supporting member 611 and pivot hole 613 are more clearly seen on the clip assembly drawing, FIG. 11. Also part of spring clip assembly 601, a second coil or other separate spring 615 is held under compression between a pivot pin end 617 and supporting member 611 to force clip 601 onto framework 107.

Figure 6:
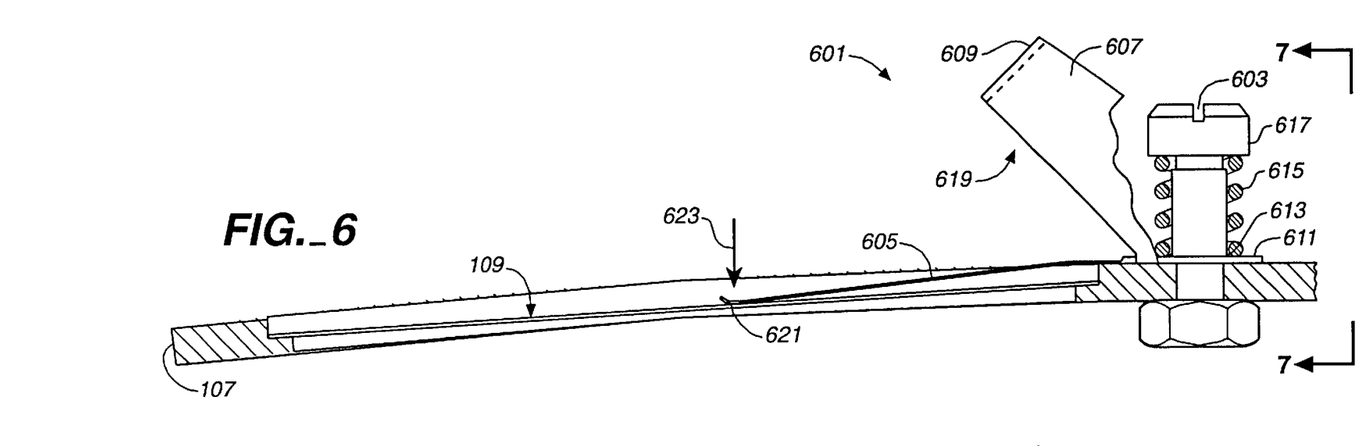
FIG. 6 is a side view of the first clip embodiment shown restraining a substrate.
Figure 7:
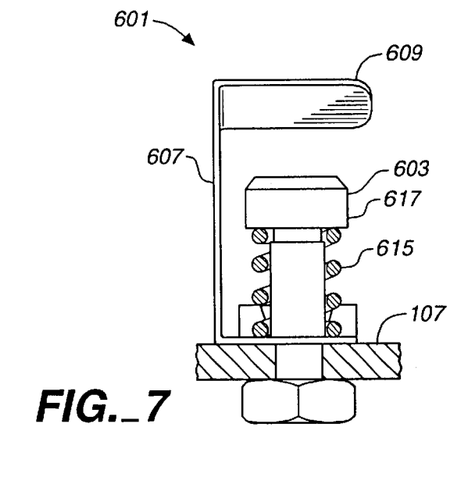
FIG. 7 is a end view of the first clip embodiment.
Figure 8:
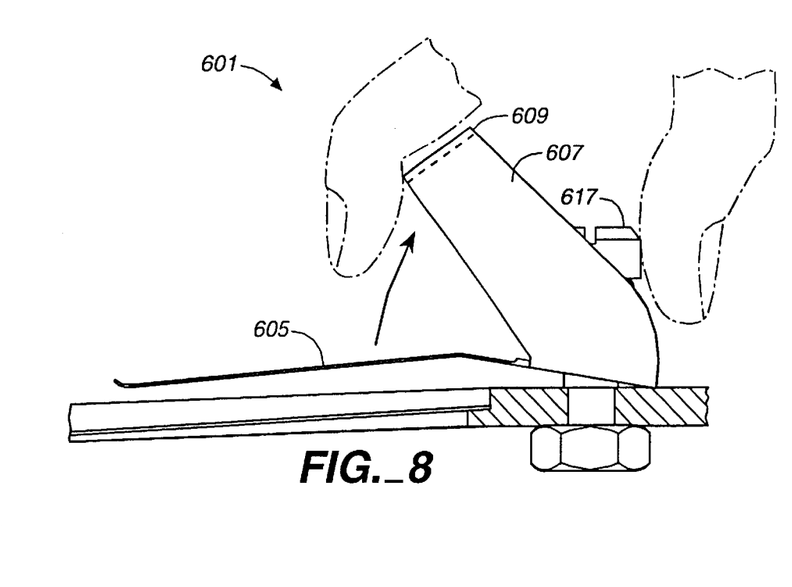
FIG. 8 is a side view of the first clip embodiment showing the application of a lifting force by an operator.

The clip of the present compound spring assembly has one or more spring elements providing the substrate restraining force and another, stiffer element providing the higher forces necessary to restrain the clip and for human manipulation of the clip. FIG. 6 shows the clip positioned to restrain a substrate. In this position spring and lever 619 is held firmly in place by the clip assembly holding force provided by a coil spring 615. A substrate restraining force 623 near the end of the cantilevered end of leaf spring or springs 605 results only from the bending action of leaf spring 605 and is spread out over a contact area 621. Coil spring 615 provides a clip assembly holding force to keep the restrained end of leaf spring 605 in place. Uncoupling of the substrate restraining force from the clip assembly holding force is provided by having a clip supporting member that is held in place by the coil spring against the action of the leaf spring, and by having a coil spring force that is greater than the leaf spring force, preferably by a factor of at least three. FIG. 8 shows the clip raised for removal or placement of the substrate in the framework. The operator has pulled handle 609 towards a pivot pin end 617 against the action of coil spring 615. Coil spring 615 is chosen to have a restraining force chosen for easy and positive manipulation by the operator, and is entirely uncoupled from substrate restraining force 623. The forces imparted on the substrate by the clip of the present invention is less than 20 grams, preferably in the range of 3 to 5 grams. In addition to uncoupling the spring forces, this configuration has the added benefit of limiting possible damage from operator error. It has been shown that for even very fragile Ga—As substrates, releasing the handle from a raised position will not transfer enough force to the substrate to damage it. Likewise, if the operator inadvertently pushes handle 609 towards substrate 109 with enough force to overcome the force of spring 615, only the relatively light force of leaf spring 605 will be transmitted to the substrate, limiting the possibility of substrate damage from the clip. Another aspect of this clip is that the handle be placed far from the substrate to reduce the likelihood of an operator inadvertently touching the wafer.

Further details of leaf spring 605 are shown in FIG. 9 top view. The leaf spring has two spring leaves 901 that are loosely coupled through a cross bar 903. The clip of the present invention is not limited to the leaf configuration of the first clip embodiment, and other embodiments with multiple leafs and cross bars will be discussed subsequently. The spreading out of contact force is an important aspect of this invention. In contrast, prior art clips have a point, or at best a small line of contact, resulting in large, localized forces on the substrate. The leaf spring spreads out the substrate restraining force over a larger area, thus reducing the maximum localized stress within the substrate and minimize the chances for substrate damage. Because of the multiple leaves 901, the restraining force from leaf 605 is shared between the pair of substrate contact areas 621, reducing the maximum substrate contact stress. The flexibility of leaves 901 allows the leaves to bend in response to contact with substrate 109, providing a larger contact area than is possible using rigid, prior art materials. Substrate restraining force 623 can be tailored to very low values, down to several grams of force, by altering the thickness, shape and material of leaf spring 605. Additional control of the force on substrate 109 is affected by the curvature in leaf spring 605 near substrate contact area 621. The purpose of cross bar 903 is to provide some linkage between leaves 901 so that they move to limit damage to leaf spring 605 in the event that one of leaves 901 is accidentally deformed by the operator.

FIG. 10 shows a view of the back side 117 of framework 107. Each aperture 201 is associated with at least one clip assembly 601, with more clips used for larger substrates and apertures. Also shown in FIG. 10 is the range of movement of clip assembly 601 from an aperture clear position 1003 to a substrate restraining position 1001. Aperture clear position 1003 is representative of the position of clip 601 when there is no substrate in its corresponding aperture, while the substrate restraining position 1001 shows the placement of clip 601 for holding substrate 109 against framework 107. In moving the clip between positions, clip 601 is grasped by the operator, providing the force to lift and rotate the clip. The lifting of clip 601 as shown in FIG. 8. A lifting force on clip 601 is generated by pinching the clip as shown in FIG. 8, or by grasping handle 609 between thumb and forefinger and pulling in the direction shown. The clip is then rotated about pivot pin 603 with between positions 1001 and 1003 by applying a slight sideways force to the end of lever arm 609.

Further detail of spring and lever 619 is presented in FIGS. 11 and 12 which show the plan view, before being bent into shape, of the sheet which will form the clip. Spring and lever 619 is formed from one piece of material by bending the sheet along the dashed lines in FIG. 11 to form the shape shown in FIGS. 6 to 9. Clip materials are chosen to be suitable for forming both a leaf spring and a rigid portion, and may be stainless steel, Inconel or other suitable spring materials, with 17-7ph stainless steel being preferred. The leaf spring thickness depends on the spring material and shape as well as the required restraining force. A thickness of 0.002 to 0.010 inch, with a preferred value of 0.004 inch will produce the low leaf spring force of the present invention. Lever arm 607, handle 609, and supporting member 611 are of a thickness and shape which allows for rigid manipulation by an operator under the force of spring 615. A thickness greater than 0.010 inch will produce the required rigidity, with 0.015 inch being the preferred value. The variation of thickness through spring and lever 619 as shown in FIG. 12 is accomplished by photochemical milling, which is also used to form the details of leaf spring 605. Other methods can also be used to manufacture the clip, including mechanical milling, shearing and stamping. The spring and lever 619 is then formed by bending the handle portion at the dotted lines indicated on FIG. 12, and by bending leaf spring 605 into the shape shown on FIG. 8, resulting in the final spring and lever shape.

Many embodiments of a compound spring mechanisms for application in this invention that would be obvious to one skilled in the art. Other obvious variations, some of which are included in further discussions of other embodiments, include incorporating the action of the coil spring into the pivot connection of the clip, various taperings of the leaf spring to produce different substrate restraining forces, increasing the number of contact points, and modifying the lever arm angle and length, to name a few variations.

Alternate Embodiments

Figure 13:
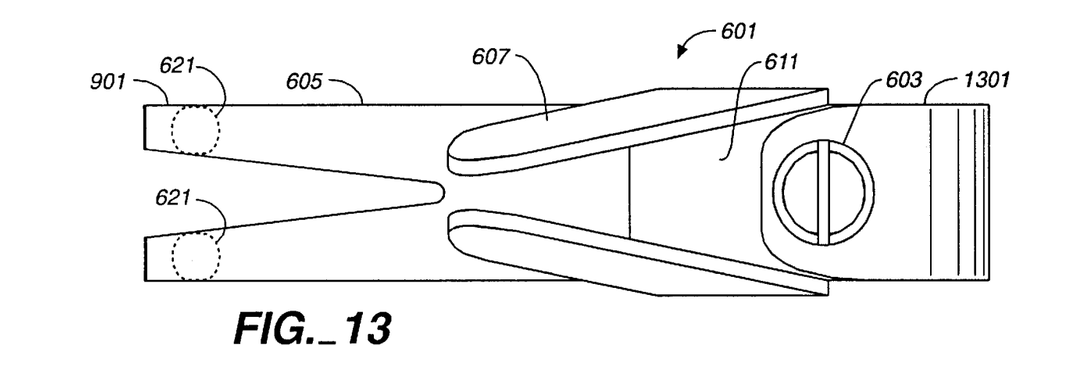
FIG. 13 is a top view of a second clip embodiment.
Figure 14:
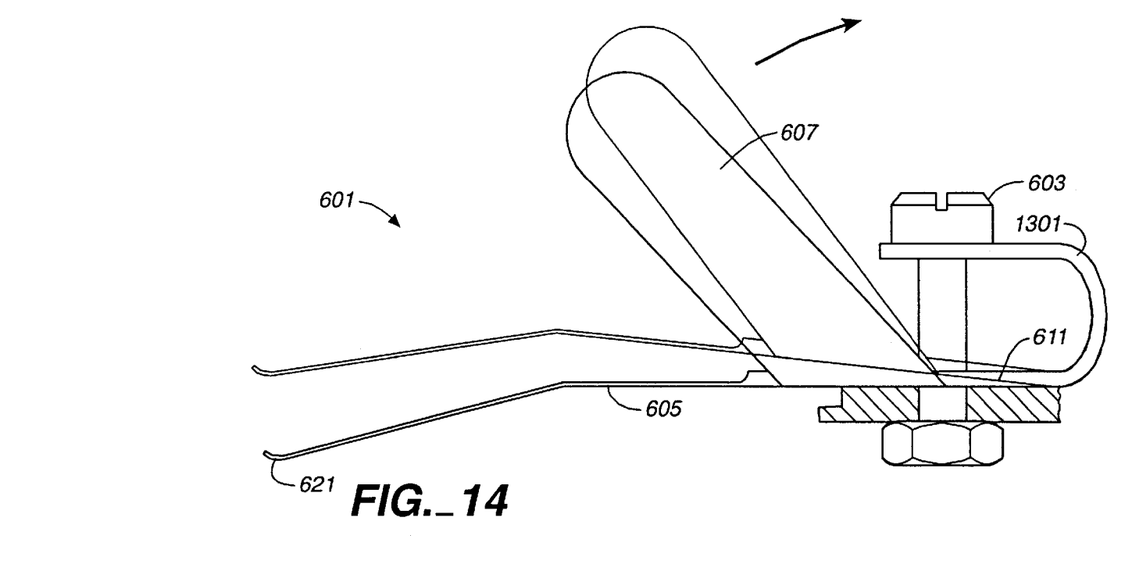
FIG. 14 is a side view of a second clip embodiment showing lifting motion.
Figure 15:
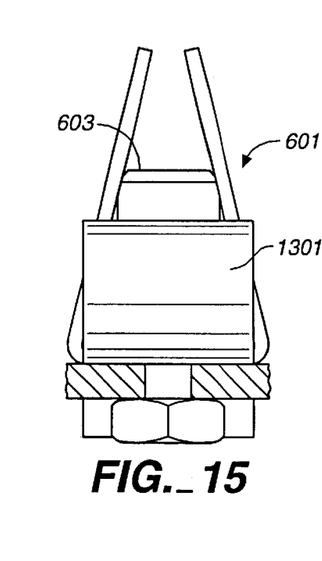
FIG. 15 is an end view of a second clip embodiment

A second embodiment of the present invention is shown in FIGS. 13 to 15. This embodiment differs from the first embodiment in three ways. First, the coil spring of the first embodiment is replaced with an integrated second spring 1301 formed as part of supporting member 611. Eliminating the coil spring of the first embodiment results in a simpler clip assembly. While this simplifies the clip design and possibly reduces the cost, there is a smaller range of second spring constants than in the first embodiment, which has a separate spring. Secondly, lever arm 607 is comprised of two portions that emanate from supporting member 611, meeting near the same location as clip handle 609 of the first embodiment. Third and lastly, spring leaves 901 are tapered as a method for producing the required leaf spring constant, and do not have the cross bar of the first embodiment.

Figure 16:
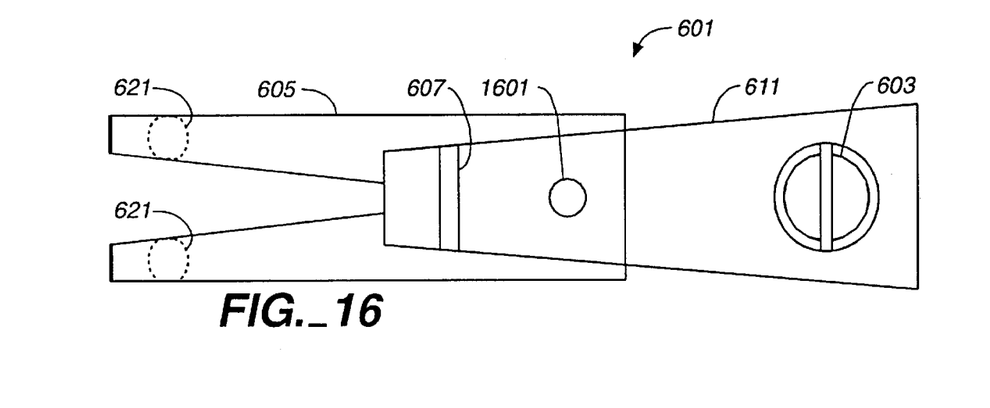
FIG. 16 is a top view of a third clip embodiment.
Figure 17:
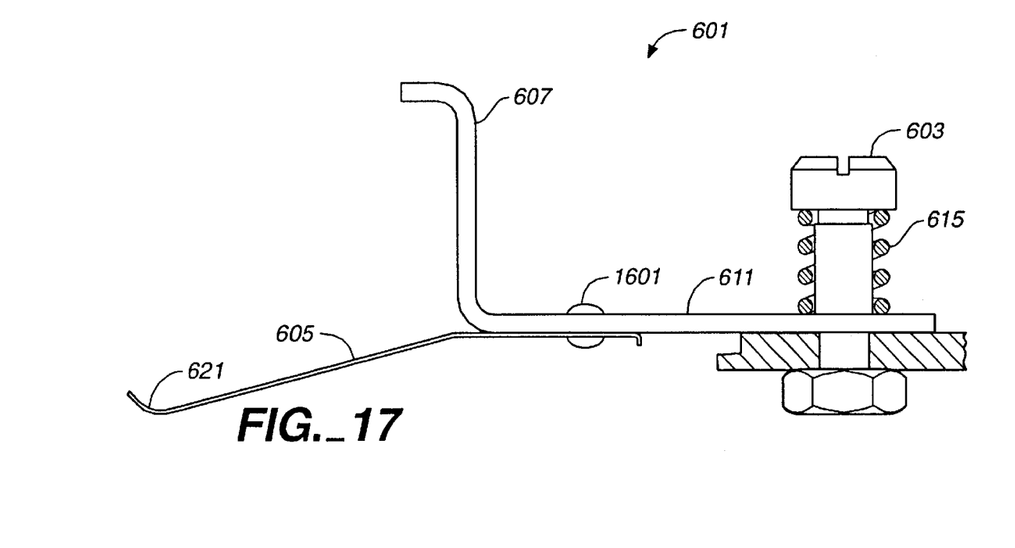
FIG. 17 is a side view of a third clip embodiment.
Figure 18:
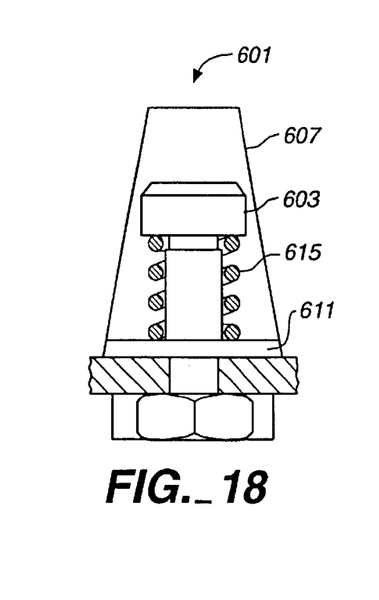
FIG. 18 is an end view of a third clip embodiment.

A third embodiment of the present invention, as shown in FIGS. 16 to 18 is bimetallic. The clip assembly is comprised of two connected materials chosen to perform the separate functions of providing the substrate restraining force and being the supporting member. The two materials and thicknesses are chosen for their mechanical properties, and so may range from being different materials and thicknesses to having some properties in common. Specifically, leaf spring 605 is made of a material and with a thickness to provide the desired substrate restraining force. Lever arm 607 and supporting member 611 is of a material and thickness to provide the rigidity for manipulation and holding leaf spring 605. A joint 1601 of the two materials is made using TIG, spot welding or any joining method appropriate for the two materials. Appropriate materials for the leaf spring include 301 stainless steel and Inconel, with 17-7ph stainless steel preferred, with thicknesses of 0.002 to 0.010 inch. The lever arm and connecting member materials can be made from 301, 303, 304, 316 stainless steel or other materials compatible with the vacuum environment, with thicknesses of 0.010 to 0.040 inch.

Figure 19:
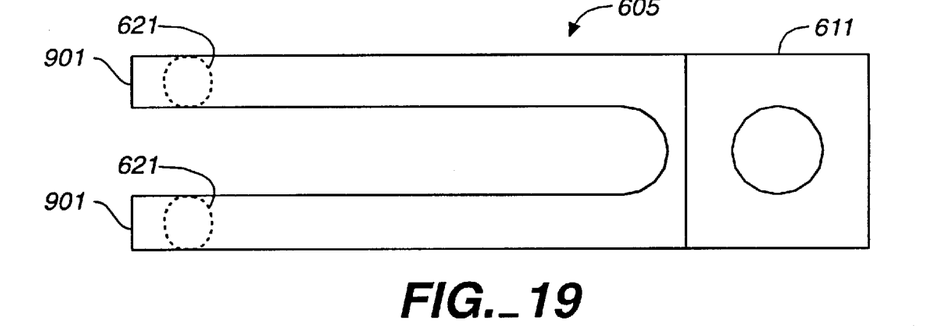
FIG. 19 shows a first alternative multiple prong designs.
Figure 20:
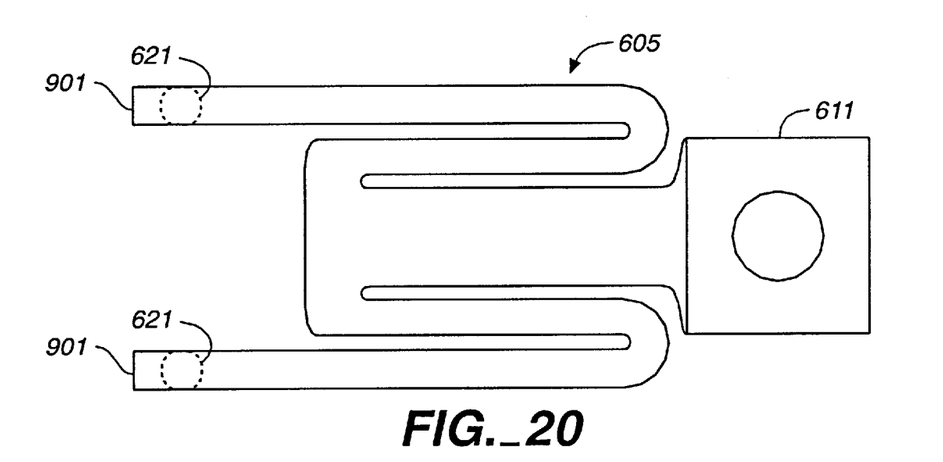
FIG. 20 shows a second alternative multiple prong designs.
Figure 21:
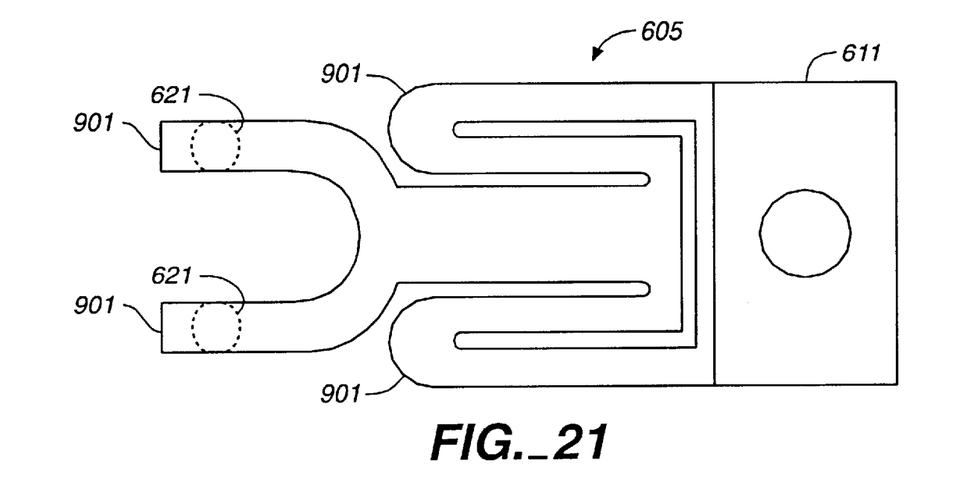
FIG. 21 shows a third alternative multiple prong designs.

Several alternate leaf configurations are shown in FIGS. 19 to 20. These FIGs demonstrate a small number of the large variety and combination of spring leaves 901 and cross bars 903 possible. The choice of leaf spring design depends on the required total spring force, individual leaf force and placement of the force on the substrate. FIG. 19 shows a leaf configuration similar to the second and third embodiments, in that there is no cross bar, but where spring leaves 901 are straight rather than tapered. Damage to the substrate is governed by the maximum pressure on the substrate, which is in term determined by the total substrate restraining force and the total contact area. The maximum pressure will be determined by the leaf spring constant, which is a function of the leaf thickness and width, and the distance that the spring is bent while holding the substrate. Variations in the leaf spring geometry can be used to control both the force and pressure on the substrate. Additional combinations of leaves and cross bars are shown in FIGS. 20 and 21, including a single leaf that bifurcates to two leaves in FIG. 20, and a two leaf version that has a larger cross bar. Additional variations in leaf design, not shown, may include more than two leaves with more than two contact locations for spreading the substrate restraining force over a larger area.

Hence, although this invention has been described with respect to the embodiment discussed here, those embodiments are illustrative only. No limitation with respect to these embodiments is intended or should be inferred. It will be observed that numerous variations and modifications may be effected without departing from the true spirit and scope of the novel concept of the invention, and it is intended that the scope of the invention be defined by the claims appended hereto.

What is claimed is:

1. A substrate support device which comprises:
   a) a framework having a back side and at least one through aperture, the aperture adapted to support an edge of a substrate positioned over the aperture from the framework back side; and
   b) a compound spring clip assembly for providing a force to urge the substrate against the framework including:
      i) a leaf spring, having a leaf spring constant, with a restrained end and a cantilevered end, the leaf spring adapted to provide a substrate restraining force on a substrate in contact with the cantilevered end,
      ii) a lever arm protruding away from the framework,
      iii) a clip supporting member connecting the lever arm to the restrained end, and
      iv) a second spring having a second spring constant at least three times greater than the leaf spring constant, the second spring providing a clip assembly holding force adapted to:
         restrain the clip supporting member against the framework against the force of the leaf spring, and
         provide resistance against which an operator must work for moving the assembly,
   whereby the operator can lift and place the clip against a substrate with a force controlled by the second spring, while the force against the substrate is controlled by the leaf spring.

2. The device according to claim 1 in which the leaf spring is comprised of a plurality of spring leaves.

3. The device according to claim 2 in which the leaf spring includes one or more cross bars interconnecting the spring leaves.

4. The device according to claims 2 or 3 in which the substrate restraining force is less than 20 grams.

5. The device according to claim 4 in which the leaf spring, lever arm, and clip supporting member are formed from one piece of metal and in which the leaf spring thickness is from 0.002 to 0.010 inch and the lever arm and clip supporting element thickness is from 0.010 to 0.040 inch.

6. The device according to claim 5 in which the leaf spring, lever arm, and clip supporting member are formed from 17-7ph stainless steel.

7. The device according to claim 5 in which the leaf spring thickness is 0.004 inch.

8. The device according to claim 5 in which the lever arm and clip supporting element is 0.015 inch.

9. The device according to claim 4 in which:
   the leaf spring consists of a first metallic piece,
   the lever arm and supporting member consists of a second metallic piece, and
   the clip assembly further includes a joint at which the first and second metallic pieces are fastened.

10. The device according to claim 4 in which the second spring is formed by bending and restraining a portion of the clip supporting member.

11. The device according to claim 4 in which the second spring is a coil spring.

12. The device according to claim 9 in which the clip assembly includes:
   a pivot pin with an axis perpendicular to the framework, and
   a pivot pin hole in the clip supporting member for accommodating the pivot pin, such that the clip assembly can be rotated about the axis of the pivot pin and clip lifting force can be provided by the fingers of an operator placed on the pivot pin and the lever arm.

13. A substrate support device which comprises:
   a) a framework having a back side and at least one through aperture, the aperture adapted to support an edge of a substrate positioned over the aperture form the framework back side; and
   b) a compound spring clip assembly for providing separate, uncoupled forces to both urge the substrate against the framework and hold the clip in place, including:
      i) a plurality of leaf springs, having a leaf spring constant, providing a substrate restraining force,
      ii) a second spring, having a second spring constant at least three times greater than the leaf spring constant, the second spring providing a clip assembly holding force,
      iii) a lever arm protruding away from the framework, and
      iv) a clip supporting member connecting the lever arm to the leaf springs, the supporting member adapted to be forced against the framework backside by the clip assembly holding force of the second spring,
   whereby the operator can lift and place the clip against a substrate with a force controlled by the second spring, while the force against the substrate is controlled by the leaf spring.

14. The device according to claim 13 in which the substrate restraining force is less than 20 grams.

15. The device according to claim 14 in which the leaf spring, lever arm, and clip supporting member are formed from one piece of metal and in which the leaf spring thickness is from 0.002 to 0.010 inch and the lever arm and clip supporting element thickness is from 0.010 to 0.040 inch.

16. The device according to claim 14 in which the leaf spring, lever arm, and clip supporting member are formed from 17-7ph stainless steel.

17. The device according to claim 15 in which the leaf spring thickness is 0.004 inch.

18. The device according to claim 15 in which the lever arm and clip supporting element is 0.015 inch.

19. The device according to claim 14 in which:
   the leaf springs consists of a first metallic piece,
   the lever arm and supporting member consists of a second metallic piece, and
   the clip assembly further includes a joint at which the first and second metallic pieces are fastened.

20. The device according to claim 14 in which the second spring is formed by bending and restraining a portion of the clip supporting member.

21. The device according to claim 14 in which the second spring is a coil spring.

22. The device according to claims 14 or 19 in which the clip assembly includes:
   a pivot pin with an axis perpendicular to the framework, and
   a pivot pin hole in the clip supporting member for accommodating the pivot pin, such that the clip assembly can be rotated about the axis of the pivot pin, and clip lifting force can be provided by the fingers of an operator placed on the pivot pin and the lever arm.

* * * * *